United States Patent [19]

Nishizawa

[11] Patent Number: 4,755,856
[45] Date of Patent: * Jul. 5, 1988

[54] ZNSE GREEN LIGHT EMITTING DIODE

[75] Inventor: Jun-ichi Nishizawa, c/o Zaidan Hojin Handotai Kenkyu Shinkokai, Kawauchi, Sendai-shi, Miyagi-ken, 980, Japan

[73] Assignee: Jun-ichi Nishizawa, Sendai, Japan

[*] Notice: The portion of the term of this patent subsequent to Aug. 14, 2001 has been disclaimed.

[21] Appl. No.: 511,005

[22] Filed: Jul. 5, 1983

[30] Foreign Application Priority Data

Jul. 6, 1982 [JP] Japan .................. 57-118037

[51] Int. Cl.$^4$ ........................................... H01L 33/00
[52] U.S. Cl. ........................... 437/80; 148/171; 437/130
[58] Field of Search ............ 357/17; 252/62.3 S; 156/DIG. 72; 29/569 L, 576 T; 148/171, 172

[56] References Cited

U.S. PATENT DOCUMENTS 4,389,256 6/1983 Nishizawa et al. .............. 148/1.5
4,465,527 8/1984 Nishizawa .................... 29/569 L
4,526,632 7/1985 Nishizawa et al. ............. 29/569 L

FOREIGN PATENT DOCUMENTS 3123231 2/1982 Fed. Rep. of Germany .
3123235 6/1982 Fed. Rep. of Germany .
2484702 12/1981 France .
2484703 12/1981 France .
2078697 1/1982 United Kingdom .
2081010 2/1982 United Kingdom .
2081011 2/1982 United Kingdom .
2107518 4/1983 United Kingdom .

OTHER PUBLICATIONS

F. V. Wald and G. Entine, "Crystal Growth of CdTe for γ-Ray Detectors" Nuclear Instruments and Methods 150 (1978) pp. 12-23.

Primary Examiner—William L. Sikes
Assistant Examiner—Robert E. Wise
Attorney, Agent, or Firm—Cushman, Darby & Cushman

[57] ABSTRACT

A green color light emitting ZnSe diode having a pn junction is fabricated by the use of a ZnSe crystal having a good crystal perfection and being obtained by a solution growth method relying on the temperature difference technique using a solvent containing at least Te and Se and using atoms of at least one kind of impurity selected from Group Ib elements of the Periodic Table as a principal impurity for producing a p type region in the crystal.

6 Claims, 4 Drawing Sheets

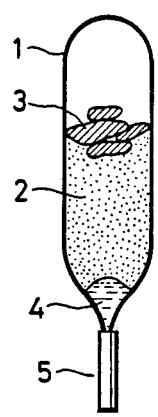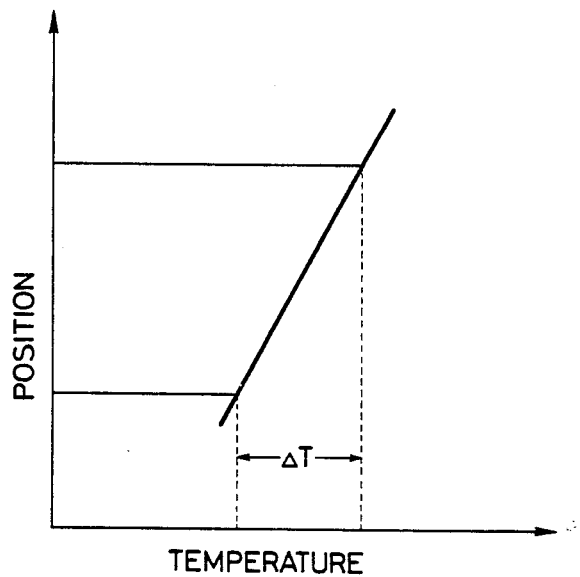
FIG. 1A
FIG. 1B

ZNSE GREEN LIGHT EMITTING DIODE

BACKGROUND OF THE INVENTION (a) Field of the Invention

The present invention relates to a semiconductor device using a Group II-VI compound semiconductor, and more particularly it pertains to a light-emitting diode using a ZnSe compound semiconductor crystal.

(b) Description of the Prior Art

Group II-VI compound semiconductor crystals (hereinafter to be referred to briefly as Group II-VI crystals) are crystals whose carrier transition is of the direct transition type, and there are several kinds of Group II-VI compound semiconductor crystals having an energy band gap ($E_g$) greater than that of Group III-V compound semiconductor crystals.

Among Group II-VI crystals, especially ZnS ($E_g=3.6$ eV), ZnSe ($E_g=2.67$ eV) and CdS ($E_g=2.5$ eV) have an energy band gap greater than that of GaP ($E_g=2.25$ eV) which has an energy band gap greater than that of Group III-V compound semiconductor crystals (hereinafter to be referred to briefly as Group III-V crystals).

Accordingly, if a pn junction diode can be made using a ZnS, ZnSe or CdS crystal to fabricate an LED, there may be expected an LED which emits light in a wavelength region shorter than the LED fabricated with a GaP crystal.

Most of the Group II-VI crystals obtained using the prior art crystal growth methods which mostly employ the so-called melt growth technique, however, are of the n type, excluding ZnTe crystal. It is the present state of the art that no control of the conductivity type of these crystals can be made, much less controlling their carrier concentrations. As such, the outstanding features of these Group II-VI crystals have not been fully realized.

Hereunder will be explained the reasons why crystals of the p type conductivity cannot be obtained in these Group II-VI crystals.

When a comparison is made between Zn atoms and Se atoms, which are the two elements constituting a ZnSe crystal, it is noted that both elements have high vapor pressures, and also that Se atoms have a vapor pressure which is about one order higher than that of Zn atoms at a same temperature. Accordingly, when a crystal of ZnSe is grown by the conventional methods, deviation from stoichiometric composition in the grown ZnSe crystal can easily develop. The pattern of this deviation assumes the tendency such that Se atoms having a higher vapor pressure escape out of the crystal to cause a shortage of Se atoms in the crystal. This tendency appears more intensively for higher growth temperatures as those represented typically by the Bridgman method.

Se vacancies which are generated due to the shortage of Se atoms in the ZnSe crystal form a donor level within the crystal, so that most of the crystals grown present by the conventional method shows n type conductivity. As stated above, it will be noted that n type crystals can be obtained either in the form of their natural occurrence, or by intentionally doping an n type impurity. If, therefore, one intends to obtain merely n type crystals, this purpose can be achieved with relative ease. In contrast thereto, it is very difficult to obtain a p type ZnSe crystal. This fact and its reasons will be described hereunder.

Even when atoms of an impurity serving as an acceptor are doped into the crystal in order to provide a crystal of the p type, or more concretely even by doping a p type impurity during the growth of a crystal, or by doping a p type impurity into an n type crystal by relying on the diffusion technique with the intent to alter a portion of this crystal into the p type, or by relying on the alloying technique, the n type crystal will still remain an n type crystal, or even when the crystal has turned successfully into a p type crystal, the resulting crystal will have a very high resistivity, and thus practically no useful p type region could have been obtained in the past.

The reasons therefor are as follows. When an acceptor impurity is doped into a crystal in order to obtain a p type crystal, there will generate, within the crystal, defects which are mainly Se vacancies and which serve as a donor, in accordance with the amount of the acceptor impurity doped, as a natural trend of the crystal to become thermodynamically stable. Thus, the acceptor carriers are compensated, which is called the self-compensation effect.

The defects within the crystal which act as a donor are comprised mostly of Se vacancies as stated above, and in addition these defects are considered to also represent a complex of these Se vacancies and the impurity atoms.

As stated above, with such a prior crystal growth method in which no consideration has been paid to the matter of deviation from the stoichiometric composition of the crystal, it has been extremely difficult to obtain a Group II-VI crystal with a controlled conductivity type, especially p type while satisfying practical purposes. Thus, the state of art may be said to be that it has been technically impossible to obtain a functional device having a pn junction from a Group II-VI compound semiconductor material represented typically by ZnSe crystal.

SUMMARY OF THE INVENTION

It is, therefore, an object of the present invention to provide the conditions which eliminate the above-mentioned drawbacks of the prior art and which make it possible to stably obtain a p type ZnSe crystal by relying on a crystal growth method for producing a high purity ZnSe crystal and with minimized deviation from stoichiometric composition.

Another object of the present invention is to provide an LED which develops an emission of light having a high efficiency in the green color region.

These and other objects of the invention are attained by a method of producing a ZnSe compound semiconductor light emitting diode that emits light in the green color region and has a p-on-n or n-on-p type pn junction. The disclosed method includes the steps of (1) preparing on a substrate crystal a first crystal of a first conductivity type by adding to a Te- and Se- containing solvent, in a predetermined Te/Se component ratio, an impurity that imparts the desired p- or n- conductivity type to the crystal to be grown. The crystal is grown using a solution growth method while maintaining a temperature difference between the solvent and the growing crystal. Next, (2) a region of a conductivity type opposite to the type formed in step (1) is formed in or on at least part of the crystal grown in step (1).

BRIEF DESCRIPTION OF THE DRAWINGS

FIG. 1A is an explanatory schematic illustration of the crystal growth apparatus (quartz ampule) employed in the present invention for growing a ZnSe crystal and FIG. 1B is a chart showing the temperature distribution during the growth process.

DETAILED DESCRIPTION OF THE PREFERRED EMBODIMENTS

Figure 2:
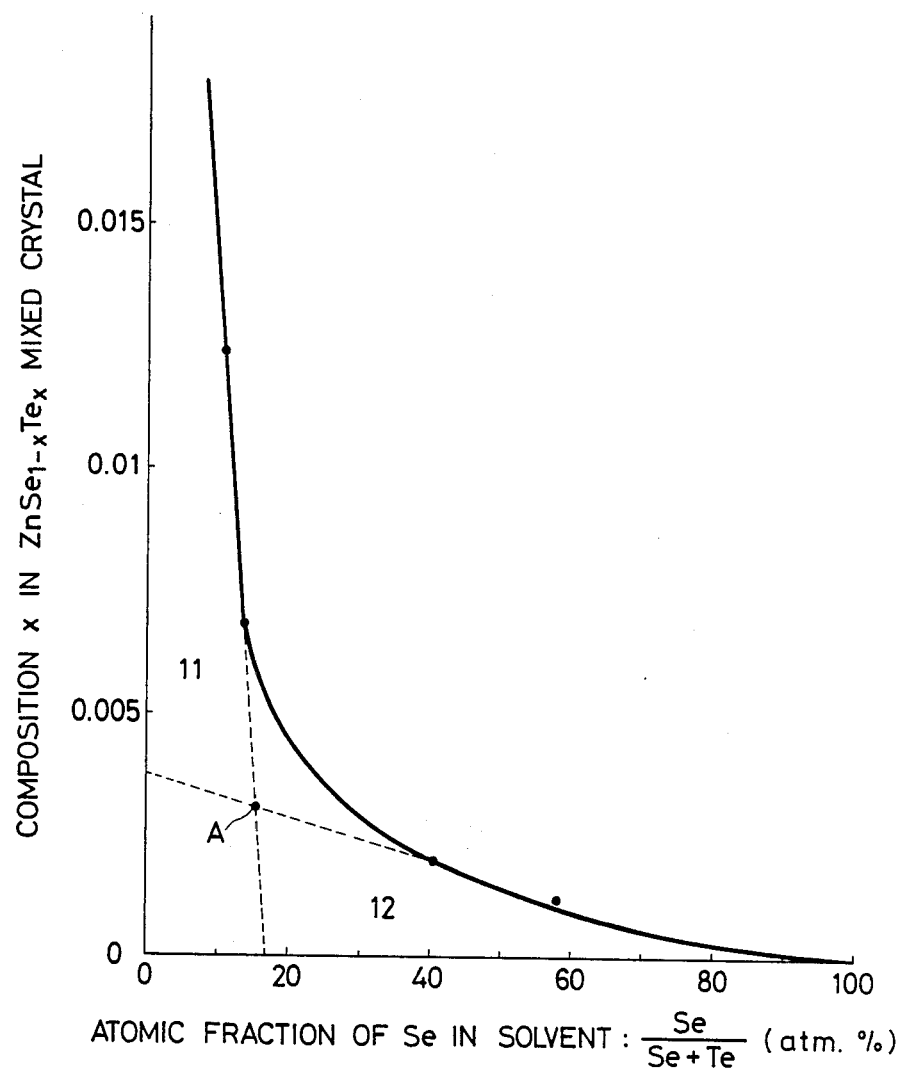
FIG. 2 is a chart showing the relationship between the atomic fraction of Se to Te in the solvent, Se/(Se+Te), employed for crystal growth according to the present invention and the fraction of composition x in the $ZnSe_{1-x}Te_x$ mixed crystal which is grown.

In order to accomplish the present invention, it is necessary that the desired p type ZnSe crystal be grown under the growth conditions which minimize deviation of the crystal from the stoichiometric composition and which enable one to obtain a high purity crystal. For this purpose, it is considered to be most effective to rely on the crystal growth method which was proposed earlier by the present inventor in U.S. patent [application Ser. No. 270,816] 4,389,256 issued June 21, 1983. Therefore, the present invention has been arrived at as a result of the use of my earlier proposed crystal growth method.

This growth method is briefly referred to as follows. As will be noted from FIGS. 1A and 1B, which show an explanatory sectional view of the growth apparatus and a temperature distribution during the growth process, a quartz ampule 1 is charged with a melt 2 serving as a solvent for the growth and with a ZnSe source crystal 3, while establishing a temperature difference ΔT between the foremost end portion 4 of the ampule wherein the source ZnSe crystal is recrystallized and the region wherein the source crystal is present, there being provided a heat sink 5 exteriorly to the bottom of said foremost end portion of the ampule for conducting an efficient growth. By maintaining both the temperature difference as well as the growth temperature constant throughout the growth process, it becomes possible to effect a solution growth of ZnSe crystal at a temperature considerably lower than that required by the known melt growth processes. Te, an element belonging to the same Group as Se atoms in the Periodic Table is added to melt 2, which is a solvent. The Te added has a vapor pressure much lower than that of Se and easily dissolves the ZnSe, either in a predominant amount or along with any other suitable metal. Thus the solvent contains a mixture of Te and Se in designed appropriate amounts.

By including said Se having a higher vapor pressure in a predetermined amount in Te, the vapor pressure which is applied to the melt during the growth process can be controlled, and this technique provides for a crystal growth method which minimizes the deviation from stoichiometric composition of the grown crystal.

Moreover, it has been found as a result of experiments that, when the content of Te in the solvent is 80% or less, the growth temperature may be set at a low level, and that this fact effectively works in making the migration of Te in the grown ZnSe crystal practically ignorably small, and that as a result the grown crystal can be substantially regarded as a ZnSe crystal as viewed from the points such as energy band gap, energy band structure and behavior of the impurity atoms (such as diffusion constant and segregation constant).

FIG. 2 shows in solid line the relationship between the atomic fraction of Se to Te, Se/(Se+Te), obtained in the abovesaid growth method and the fraction of composition x of the grown $ZnSe_{1-x}Te_x$ mixed crystal.

The characteristics and the crystal perfection of the $ZnSe_{1-x}Te_x$ mixed crystal which, as stated above, can be regarded practically as a ZnSe crystal were examined, and interesting results found.

That is, the Se content in the solvent has the effect of controlling the deviation from stoichiometric composition of the grown crystal. The tangential lines (dotted lines) drawn for this curve as indicated in FIG. 2 illustrate that when the growth is conducted under the conditions of area 11 indicated on the outside of the tangential line which is on the left side of the solid curve, i.e. when the amount of Se is small, the crystal which is grown will easily tend to develop Se vacancies. Since Te will enter into the lattice sites of Se to fill these Se vacancies, there can be formed a crystal having such a tolerably large content of Te as will still permit one to regard this crystal as practically a ZnSe crystal. Such a crystal will have minimized defects such as Se vacancies, and thus have a good crystal perfection.

On the other hand, under the conditions of area 12 indicated on the outside of the tangential line which is provided on the right side of the solid curve, the abundancy of Se in the solvent minimizes the deviation from stoichiometric composition of the crystal, so that Se vacancies are difficult to develop. Accordingly, in case an impurity of either Group Ia or Ib is introduced simultaneously, this impurity will substitute the Zn lattice sites to grow a p type crystal. The above facts have been found as the result of applicants experiments. As stated above, I have determined the conditions for controlling the conductivity type of a ZnSe crystal by varying the content of Se relative to Te in the solvent.

Accordingly, it is desirable to grow a p type crystal by introducing a p type impurity in the solvent and under the conditions noted on the right side of the intersection of the two dotted lines in FIG. 2, and also to grow an n type crystal under the conditions mentioned on the left side of the intersection.

As stated above, the crystal growth method employed in the present invention is such that the Se content in the solvent partly containing Te having a high solubility for the ZnSe crystal and a lower vapor pressure is utilized in controlling the stoichiometric composition of the crystal being grown, and by introducing an impurity thereto, it is possible to grow a crystal which has been arbitrarily controlled to determine its conductivity type. In the present invention, a p type impurity of Group Ib such as Au, Ag and Cu which forms a deep level is doped into the crystal being grown according to the above-mentioned crystal growth method. That is, Group Ia elements in the Periodic Table such as Li, Na and K and Group Ib elements such as Cu, Au and Ag are considered to be suitable as an impurity for preparing a ZnSe crystal of the p type. Thus, these impurities were introduced into ZnSe crystals in experiments, and pn junction diodes were manufactured.

The results was that a Group Ib element such as Au, Ag and Cu formed a deep acceptor level in the ZnSe crystal, and this deep level indeed associated with the radiating process, thus it was possible to obtain an LED having light emission spectra in exactly the green color region.

The diodes obtained according to the method of the present invention are described below.

EXAMPLE 1

This example pertains to the instance wherein the grown crystal is of the p type.

In general, it is only necessary to set the atomic fraction of Se to Te in the solvent, i.e. Se/(Se+Te), so as to be larger than the value at the cross point A in FIG. 2 at the time a ZnSe crystal is grown, and to introduce an appropriate amount of an impurity such as Au, Ag and Cu in the solvent employed. In order to obtain a pn junction diode, it is only necessary to anneal said p type ZnSe crystal in a Zn solution at 1000° C. for 10~60 minutes, and to form an n type layer of about 10~25 μm. In practice, a ZnSe pn-junction diode was tentatively manufactured by relying on the fabrication process stated below.

3 g of Te, 0.5 g of Se and 3 g of ZnSe were charged in the quartz ampule 1 shown in FIG. 1A, and mixed simultaneously with 1 mg of Au which was a p type impurity. The ampule was sealed off at a degree of vacuum greater than $1 \times 10^{-6}$ Torr. This ampule was subjected to a growth process for 120 hours at a growth temperature of 950° C. and at a temperature difference of 20° C. Whereupon, a growth commenced at the foremost end portion of the ampule, and it was possible to grow a ZnSe single crystal of 8 mm in diameter and 10 mm in length. This crystal was of the p type, with the impurity concentration being in the range of $10^{15} \sim 10^{17}$/cm$^3$. This crystal was cut in parallel with the orientation of (111) face into a disk of 0.5~0.7 mm in thickness. One side of this disk was polished up to a mirror surface state to provide a surface for later effecting a diffusion.

The diffusion process was conducted in such manner that, after cleaning, the wafer was placed, together with 5 g of Zn, in a quartz ampule and sealed off, and then the ampule was subjected to a heat treatment at 1000° C. for 30 minutes. The wafer was separated from the Zn solution by, for example, tilting the ampule at a high temperature. By this process, it was possible to form an n type layer having an impurity concentration of about $10^{17}$/cm$^3$ up to a depth of about 10 μm from the surface of the wafer. The thickness of the other side of the disk which was not the mirror surface was adjusted by lapping, and thereafter followed by polishing and etching. A metal layer was attached to each surface for ohmic contact. This metal electrode was formed by vacuum deposition of, for example, Au for the p type layer, and In or In-Sn was evaporation-deposited or attached by an alloying process, for the n type layer. As the subsequent heat treatment intended for improving the contact between the metal and the crystal, the assembly was heated in such an inert gas as Ar or N$_2$ at 350° C. for about 10 minutes. This latter process had better been employed.

Figure 3:
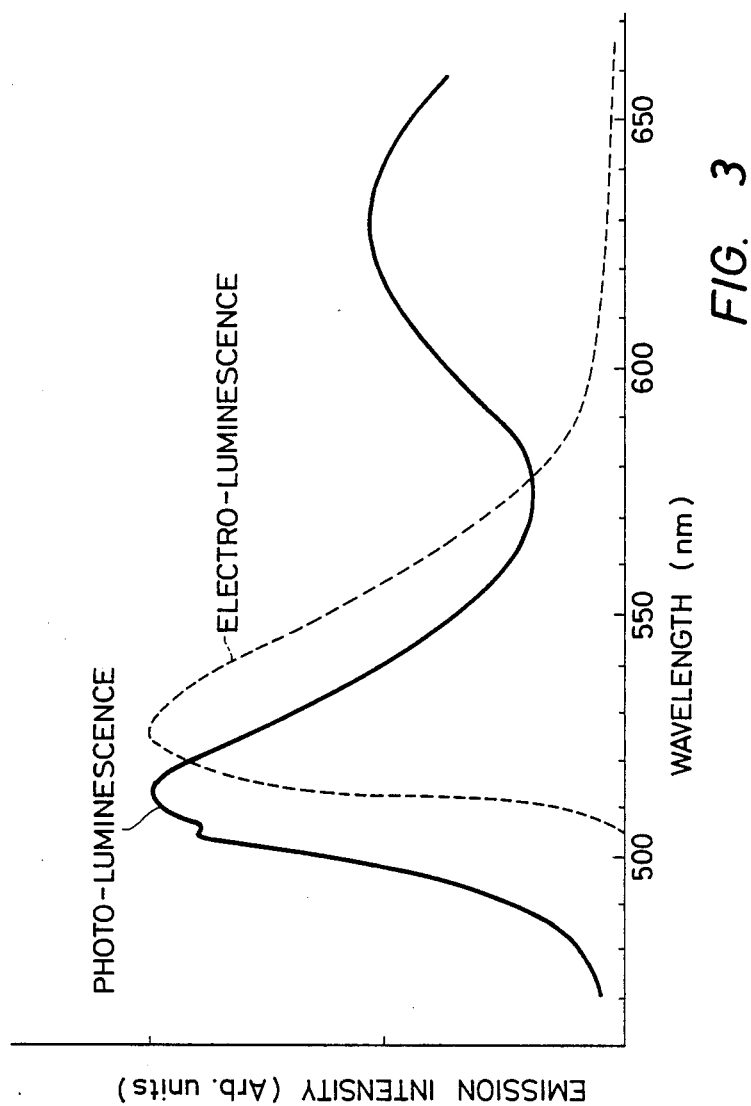
FIG. 3 is a chart showing the emission spectra (EL) of the ZnSe pn-junction LED obtained according to the present invention and the spectra of photo-luminescence (PL) of the p type ZnSe crystal obtained according to the present invention.
Figure 4:
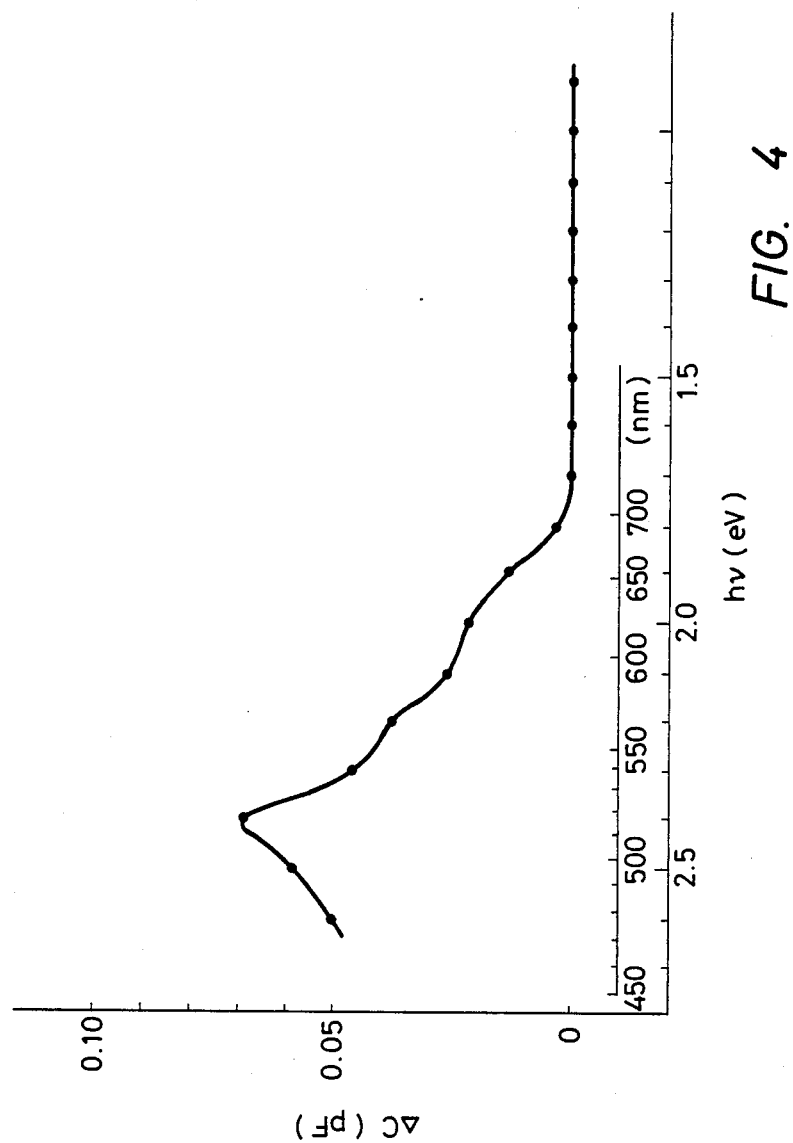
FIG. 4 is a chart showing the relationship between the change in the capacitance of the ZnSe pn-junction LED obtained in the present invention by relying on the photocapacitance technique and the photon and wavelength of irradiated monochromatic light to this LED.

The current-voltage characteristics of the diode obtained in the above-mentioned fabrication process were examined. It was found that the product was a good diode having a forward voltage of 2.7 V and a breakdown voltage of −30 V. By forwardly biasing this diode, it was possible to obtain an emission of light (EL) having emission spectra with the peak being 530 nm, i.e. of a green color, as shown in FIG. 3. In the chart of FIG. 3, there is concurrently shown the photo-luminescence (PL) of the p type ZnSe crystal after the growth. Each of these results of photo-luminescence indicates that Au has been doped invariably to render the crystal into a p type ZnSe crystal. Thus, these luminescences are considered to represent the emission of light which is associated by the level formed by Au. Furthermore, the result of measurement, by the photo-capacitance technique, of the position of the deep level formed in this diode is shown in FIG. 4. It has been confirmed that a deep level is formed mainly in the vicinity of 520 nm (about 2.4 eV).

EXAMPLE 2

This example concerns the instance wherein the grown crystal is of the n type.

In general terms, an n type crystal is obtained either by setting the atomic fraction of Se to Te, Se/(Se+Te), in the solvent to be smaller than the value at the cross point A in FIG. 2, and introducing, into the solvent, an appropriate amount of a Group IIIb element such as Ga, Al, and In, or by performing the growth without introducing any impurity, and thereafter subjecting the grown crystal to a thermal annealing in the Zn solution at 1000° C. for about 24~48 hours.

The n type ZnSe crystal employed in the method of the present invention has few defects such as Se vacancies. Accordingly, even when a p type impurity is doped to form a pn junction, a self-compensation effect hardly occurs, and thus a p type region can be obtained easily.

Electrodes are formed by relying on such technique that, firstly in order to form a p type region on one side of the crystal, Au is evaporation deposited, and then In which is intended for ohmic contact with the n type ZnSe crystal is placed on the other side of the crystal, and the resulting crystal is subjected to an alloying process in an Ar gas atmosphere at 300°~400° C. for 1~10 minutes. Thus, a diode can be made.

In practice, a pn diode was manufactured in the following manner. The amounts of the charge of ZnSe and Se placed in the ampule were substantially the same as those mentioned in Example 1, with the exception of the amount of Te, and the growth conditions given in the region on the left side of FIG. 2 were used. As a result, an n type crystal was obtained. In similar procedure as in Example 1, Au was evaporation-deposited on this crystal. Electrodes were provided in similar manner as employed in Example 1. As a result, a pn junction was formed. In this case, Au was evaporation-deposited, and by diffusing the deposited Au into the n type crystal, a p type region was formed on top of the n type crystal. Thus, a diode was fabricated. This diode exhibited almost the same characteristics as those obtained in Example 1, including the I-V characteristic and the emission spectra as a diode.

As stated above, according to the present invention, it has been noted that, in case of a pn junction containing a p type crystal which has been formed either by including or diffusing Au into a ZnSe, this Au has formed a deep level in the crystal, and this deep level acts as the center participating in the emission of light. As a result, an intensive green light is emitted.

This light has a wavelength shorter than that of the conventional GaP diode which emits a purely green light. Accordingly, there is obtained a color corresponding to the green color region of, for example, the traffic signal lamps, and moreover there can be obtained a very high efficiency of about 0.05% as represented by a very bright light. Thus, according to the present invention, there can be provided semiconductor devices having very wide values of applications industrially. It is needless to say that, as the p type impurity, there can be used equally effectively other Group Ib elements such as Ag and Cu.

What is claimed is:

1. A method of producing a ZnSe compound semiconductor light emitting diode emitting light in the green color region and having a p-on-n type or n-on-p type pn junction, said method comprising the steps of:
   (1) preparing on a substrate crystal a first crystal of a first conductivity type by adding to a Te and Se containing solvent, in a predetermined Te/Se component ratio, an impurity imparting the desired p or n conductivity type to the crystal to be grown, and growing said crystal by a solution growth method while maintaining a temperature difference between the solvent and the growing crystal; and
   (2) forming a region of a conductivity type opposite to the conductivity type formed in step (1) in or on at least part of the crystal grown in step (1).

2. The method of producing a light emitting ZnSe diode according to claim 1 in which Au, Ag or Cu is added to the solvent when a p type crystal is grown.

3. The method of producing a light emitting ZnSe diode according to claim 1 in which the solvent has an atomic fraction Se/(Se+Te) greater than 18 atomic % to grow a p type crystal.

4. The method of producing a light emitting ZnSe diode according to claim 1 in which the region formed in step (2) is by a solution growth method in which a temperature difference is maintained between the solvent and the crystal grown in step (1).

5. The method of producing a light emitting ZnSe diode according to claim 1 in which the p type region is produced when the atomic fraction Se/(Se+Te) in the solvent has a value greater than 18 atomic %, the n type region is produced when the atomic fraction Se/(Se+Te) is less than 15 atomic %.

6. The method of producing a light emitting ZnSe diode according to claim 1 in which an n type conductivity is obtained by subjecting a portion of the p type region of the ZnSe crystal to thermal annealing in a Zn solution to change its conductivity type to the n type.

* * * * *